United States Patent
Parthasarathy et al.

(10) Patent No.: US 10,135,465 B2
(45) Date of Patent: *Nov. 20, 2018

(54) ERROR CORRECTION METHODS AND APPARATUSES USING FIRST AND SECOND DECODERS

(71) Applicant: Micron Technology, Inc., Boise, ID (US)

(72) Inventors: Sivagnanam Parthasarathy, Carlsbad, CA (US); Mustafa Nazmi Kaynak, San Diego, CA (US); Patrick Robert Khayat, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/434,210

(22) Filed: Feb. 16, 2017

(65) Prior Publication Data
US 2017/0163287 A1    Jun. 8, 2017

Related U.S. Application Data

(63) Continuation of application No. 13/672,433, filed on Nov. 8, 2012, now Pat. No. 9,577,673.

(51) Int. Cl.
H03M 13/00    (2006.01)
H03M 13/11    (2006.01)
(Continued)

(52) U.S. Cl.
CPC ..... *H03M 13/1108* (2013.01); *H03M 13/152* (2013.01); *H03M 13/29* (2013.01);
(Continued)

(58) Field of Classification Search
CPC ........... H03M 13/1108; H03M 13/152; H03M 13/2906; H03M 13/2957; H03M 13/29;
(Continued)

(56) References Cited

U.S. PATENT DOCUMENTS 4,112,502 A    9/1978 Scheuneman
5,942,004 A    8/1999 Cappelletti
(Continued)

FOREIGN PATENT DOCUMENTS

JP    2000149592    5/2000
KR    100766042    10/2007
(Continued)

OTHER PUBLICATIONS

Ohtsuki, T.; "Rate adaptive indoor infrared wireless communication systems using repeated and punctured convolutional codes," Communications, 1999. ICC '99. 1999 IEEE International Conference on, vol. 1, No., pp. 609-613 vol. 1, 1999.
(Continued)

*Primary Examiner* — Albert Decady
*Assistant Examiner* — Osman M Alshack
(74) *Attorney, Agent, or Firm* — Brooks, Cameron & Huebsch, PLLC

(57) ABSTRACT

Apparatuses and methods for error correcting data are provided. A first error correction code (ECC) decoder is configured to decode a first codeword to provide a first result and to decode a second codeword to provide a second result. The decoder is configured to run up to a particular number of iterations to provide each of the results. A second ECC decoder is configured to decode a third codeword to provide decoded data, wherein the third codeword comprises the first result and the second result. An evaluation module is configured to initiate a recovery scheme responsive to the decoded data including an error.

17 Claims, 4 Drawing Sheets

(51) Int. Cl.
*H03M 13/29* (2006.01)
*H03M 13/15* (2006.01)
*G11B 20/18* (2006.01)

(52) U.S. Cl.
CPC ... *H03M 13/2906* (2013.01); *H03M 13/6502* (2013.01); *G11B 20/1833* (2013.01); *H03M 13/1102* (2013.01)

(58) Field of Classification Search
CPC .............. H03M 13/27; H03M 13/1102; H03M 13/1154; H03M 13/255; H03M 13/15; G11B 20/1833
USPC ........ 714/752, 755, 763, 780, 784, 800–805
See application file for complete search history.

(56) References Cited

U.S. PATENT DOCUMENTS

| | | | |
|---|---|---|---|
| 5,956,743 A | 9/1999 | Bruce et al. | |
| 6,023,781 A | 2/2000 | Hazama | |
| 6,128,222 A | 10/2000 | Moreaux | |
| 6,279,133 B1 | 8/2001 | Vafai et al. | |
| 6,591,394 B2 | 7/2003 | Lee et al. | |
| 6,628,723 B1 | 9/2003 | Gerlach et al. | |
| 6,731,538 B2 | 5/2004 | Noda et al. | |
| 6,732,322 B1 | 5/2004 | Miyauchi et al. | |
| 6,839,870 B2 | 1/2005 | Fanfelle et al. | |
| 6,871,303 B2 | 3/2005 | Halter | |
| 6,895,543 B2 | 5/2005 | Hazama | |
| 7,061,804 B2 | 6/2006 | Chun et al. | |
| 7,184,356 B2 | 2/2007 | Noguchi et al. | |
| 7,324,398 B2 | 1/2008 | Shim et al. | |
| 7,389,465 B2 | 6/2008 | Radke et al. | |
| 7,451,383 B2 | 11/2008 | Kim et al. | |
| 7,478,314 B1 | 1/2009 | Cheong et al. | |
| 7,643,342 B2 | 1/2010 | Litsyn et al. | |
| 7,739,576 B2 | 6/2010 | Radke | |
| 7,844,879 B2 | 11/2010 | Ramamoorthy et al. | |
| 7,860,200 B2 | 12/2010 | Furman et al. | |
| 7,904,780 B2 | 3/2011 | Brandman | |
| 7,904,793 B2 | 3/2011 | Mokhlesi et al. | |
| 7,962,831 B2 | 6/2011 | Park et al. | |
| 8,046,542 B2 | 10/2011 | Radke | |
| 8,046,660 B2 | 10/2011 | Wu et al. | |
| 8,051,358 B2 | 11/2011 | Radke | |
| 8,065,583 B2 | 11/2011 | Radke | |
| 8,156,403 B2 | 4/2012 | Shalvi et al. | |
| 8,190,976 B1 | 5/2012 | Wu et al. | |
| 8,194,441 B2 | 6/2012 | Thiruvengadam | |
| 8,234,536 B1* | 7/2012 | Farjadrad | H03M 13/1111 370/335 |
| 8,321,752 B1* | 11/2012 | Yang | H03M 13/2927 714/757 |
| 8,429,498 B1* | 4/2013 | Anholt | G06F 11/1048 365/227 |
| 8,645,789 B2 | 2/2014 | Sharon et al. | |
| 8,713,411 B2* | 4/2014 | Kong | G06F 11/1072 714/774 |
| 8,788,910 B1 | 7/2014 | Northcott | |
| 8,793,556 B1 | 7/2014 | Northcott et al. | |
| 8,910,000 B2 | 12/2014 | Bedeschi | |
| 8,972,824 B1 | 3/2015 | Northcott et al. | |
| 8,996,957 B1 | 3/2015 | Northcott | |
| 9,001,575 B2 | 4/2015 | Bedeschi | |
| 9,015,562 B1 | 4/2015 | Song et al. | |
| 2002/0120820 A1 | 8/2002 | Higuchi et al. | |
| 2003/0088821 A1 | 5/2003 | Yokokawa et al. | |
| 2003/0112879 A1 | 6/2003 | Antia et al. | |
| 2003/0156454 A1 | 8/2003 | Wei et al. | |
| 2004/0268065 A1 | 12/2004 | Hilton et al. | |
| 2005/0114587 A1 | 5/2005 | Chou et al. | |
| 2006/0221752 A1 | 10/2006 | Fasoli et al. | |
| 2007/0061689 A1 | 3/2007 | Park et al. | |
| 2007/0124647 A1 | 5/2007 | Chen et al. | |
| 2007/0162826 A1 | 7/2007 | Major et al. | |
| 2007/0171714 A1 | 7/2007 | Wu et al. | |
| 2007/0171730 A1 | 7/2007 | Ramamoorthy et al. | |
| 2007/0266295 A1 | 11/2007 | Conley | |
| 2007/0266296 A1 | 11/2007 | Conley | |
| 2008/0010582 A1 | 1/2008 | Nieto et al. | |
| 2008/0034272 A1 | 2/2008 | Wu et al. | |
| 2008/0109703 A1* | 5/2008 | Brandman | G06F 11/1068 714/763 |
| 2008/0137414 A1 | 6/2008 | Park et al. | |
| 2008/0148125 A1* | 6/2008 | Bhora | H04L 1/0051 714/755 |
| 2008/0163023 A1 | 7/2008 | Hong et al. | |
| 2008/0163026 A1 | 7/2008 | Varnica et al. | |
| 2008/0168319 A1 | 7/2008 | Lee et al. | |
| 2008/0294960 A1 | 11/2008 | Sharon et al. | |
| 2008/0320361 A1 | 12/2008 | Fukuda et al. | |
| 2008/0320373 A1 | 12/2008 | Kim et al. | |
| 2009/0013233 A1 | 1/2009 | Radke | |
| 2009/0013234 A1 | 1/2009 | Radke | |
| 2009/0037627 A1 | 2/2009 | Rofougaran | |
| 2009/0070651 A1 | 3/2009 | Diggs et al. | |
| 2009/0086824 A1* | 4/2009 | Lin | H04N 19/44 375/240.25 |
| 2009/0100307 A1 | 4/2009 | Lee | |
| 2009/0129169 A1 | 5/2009 | Roohparvar et al. | |
| 2009/0132755 A1 | 5/2009 | Radke et al. | |
| 2009/0132889 A1 | 5/2009 | Radke et al. | |
| 2009/0147608 A1 | 6/2009 | Klein | |
| 2009/0199073 A1 | 8/2009 | Kanaoka et al. | |
| 2009/0212820 A1* | 8/2009 | Toriumi | G11C 8/10 326/105 |
| 2009/0241008 A1* | 9/2009 | Kim | G06F 11/1072 714/755 |
| 2009/0271688 A1 | 10/2009 | Jiang et al. | |
| 2010/0023800 A1 | 1/2010 | Harari et al. | |
| 2010/0115376 A1 | 5/2010 | Shalvi et al. | |
| 2010/0199153 A1 | 8/2010 | Okamura et al. | |
| 2011/0055660 A1 | 3/2011 | Dudeck et al. | |
| 2011/0060969 A1 | 3/2011 | Ramamoorthy et al. | |
| 2011/0126077 A1 | 5/2011 | Park et al. | |
| 2011/0239081 A1 | 9/2011 | Hida et al. | |
| 2012/0014451 A1* | 1/2012 | Lee | H04N 19/436 375/240.16 |
| 2012/0082460 A1 | 4/2012 | Wu et al. | |
| 2013/0166988 A1* | 6/2013 | Sharon | G06F 11/1012 714/758 |
| 2013/0318418 A1 | 11/2013 | Bedeschi | |
| 2014/0082456 A1 | 3/2014 | Liu et al. | |

FOREIGN PATENT DOCUMENTS

| | | |
|---|---|---|
| WO | 2004062113 | 7/2004 |
| WO | WO 2004062113 | 7/2004 |
| WO | 2006070668 | 7/2006 |
| WO | WO 2006070668 | 7/2006 |
| WO | 2007068554 | 6/2007 |
| WO | WO 2007/068554 | 6/2007 |
| WO | 2007084751 | 7/2007 |
| WO | WO 2007084751 | 7/2007 |

OTHER PUBLICATIONS

Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US2008/068236, filed Jun. 25, 2008; dated Jan. 20, 2009.

The International Bureau of WIPO; International Preliminary Report on Patentability of related PCT Application No. PCT/US2008/068240, filed Jun. 25, 2008; dated Jan. 12, 2010; Geneva, Switzerland.

USPTO; Office Action dated Jan. 11, 2011; from related U.S. Appl. No. 11/774,377, filed Jul. 6, 2007.

(56) References Cited

OTHER PUBLICATIONS

Patent Application Titled "Phase Change Memory State Determination Using Threshold Edge Detection," U.S. Appl. No. 12/889,372, filed Sep. 23, 2010, 29 pages.
Patent Application Titled "Encoding Program Bits to Decouple Adjacent Wordlines in a Memory Device," U.S. Appl. No. 13/435,243, filed Mar. 30, 2012, 24 pages.
Patent Application Titled "Program-Disturb Management for Phase Change Memory," U.S. Appl. No. 13/474,609, filed May 17, 2012, 30 pages.
N. Xie et al., "Concatenated Low-Density Parity-Check and BCH Coding System for Magnetic Recording Read Channel with 4 kB Sector Format," IEEE Trans. on Magnetics, vol. 44, No. 12, Dec. 2008, pp. 4784-4789.
E. Yeo, "An LDPC-Enabled Flash Controller in 40 nm CMOS," Flash Memory Summit 2012, Santa Clara, CA.
M. Jedrak, "ECC in NAND Flash Controller," Flash Memory Summit 2012, Santa Clara, CA.
N. Xie et al., "Concatenated Low-Density Parity-Check and BCH Coding Sytem for Magnetic Recording Read Channel with 4 kB Sector Format," IEEE Trans. on Magnetics, vol. 44, No. 12, Dec. 2008, pp. 4784-4789.
Daneshgaran, et al.; "An extensive search for good punctured rate-k/(k+1) recursive convolutional codes for serially concatenated convolutional codes," Information Theory, IEEE Transactions on, vol. 50, No. 1, pp. 208-217, Jan. 2004.
Frenger, et al.; "zRate-compatible convolutional codes for multirate DS-CDMA systems," Communications, IEEE Transactions on, vol. 47, No. 6, pp. 828-836, Jun. 1999.
Ohtsuki, T.; "Rate adaptive indoor infrared wireless communication systems using repeated and punctured convolutional codes," Communications, 1999. ICC '99. 1999 IEEE International Conference, vol. 1, pp. 609-613, 1999.
Zhou, et al.; "High rate turbo code using unevenly punctured convolutional constituent code," Communications, 1999. APCC/OECC '99. Fifth Asia-Pacific Conference on . . . and Fourth Optoelectronics and Communications Conference, vol. 1, No., pp. 751-754 vol. 1, 1999.
Korean Intellectual Property Office; "Notification of Transmittal of the International Search Report and Written Opinion of the International Searching Authority, or the Declaration", "Written Opinion of the International Searching Authority", and "International Search Report" of corresponding PCT application PCT/US2008/068236, filed Jun. 25, 2008; dated Jan. 20, 2009.
The International Bureau of WIPO; International Preliminary Report on Patentability of related PCT Application No. PCT/US2008/068236, filed Jun. 25, 2008; dated Jan. 12, 2010; Geneva, Switzerland.
Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US2008/068240, filed Jun. 25, 2008, dated Dec. 29, 2008.
The International Bureau of WIPO; International Preliminary Report of Patentability of related PCT Application No. PCT/US2008/068240, filed Jun. 25, 2008, dated Jan. 12, 2010; Geneva Switzerland.
Korean Intellectual Property Office; "Notification of Transmittal of the International Search Report and the Written Opinion of the International Searching Authority, or the Declaration", "Written Opinion of the International Searching Authority", and "International Search Report" of corresponding PCT application PCT/US2008/081475, filed Oct. 28, 2008; dated Feb. 18, 2009; Daejeon, Republic of Korea.
Korean Intellectual Property Office; "Notification of Transmittal of the International Search Report and the Written Opinion of the International Searching Authority, or the Declaration", "Written Opinion of the International Searching Authority", and "International Search Report" of related International Application PCT/US2008/081473, filed Oct. 28, 2008; dated Feb. 19, 2009; Daejeon, Republic of Korea.
Korean Intellectual Property Office; "Notification of Transmittal of the International Search Report and the Written Opinion of the International Searching Authority, or the Declaration", "Written Opinion of the International Searching Authority", and "International Search Report" of related International Application PCT/US2008/081479, filed Oct. 28, 2008; dated Jun. 29, 2009.
European Patent Office; Extended European Search Report of related European Application, Application No. 08852229.7; dated Dec. 9, 2011.
European Patent Office; Extended European Search Report of related European Application, Application No. 08851231.4; dated Jan. 30, 2012.
European Patent Office; Extended European Search Report of related European Application, Application No. 08854324.4; dated Jun. 6, 2011.
Chinese State Intellectual Property Office; Office Action of related Chinese Application No. 200880117050.0; dated Jun. 6, 2012.
USPTO; Office Action dated Apr. 12, 2011, from related U.S. Appl. No. 11/774,316, filed Jul. 6, 2007.
USPTO; Office Action dated Nov. 30, 2011, from related U.S. Appl. No. 13/267,262, filed Oct. 6, 2011.
UPTO; Office Action dated Jan. 11, 2011; from related U.S. Appl. No. 11/774,377, filed Jul. 6, 2007.
USPTO; Office Action dated May 16, 2011; from related U.S. Appl. No. 11/774,377, filed Jul. 6, 2007.
USPTO; Office Action dated Dec. 9, 2011; from U.S. Appl. No. 13/281,007, filed Oct. 25, 2011.
USPTO; Office Action dated Mar. 15, 2012; from U.S. Appl. No. 11/943,943, filed Nov. 21, 2007.
USPTO; Office Action dated Sep. 9, 2010; from U.S. Appl. No. 11/944,023, filed Nov. 21, 2007.
USPTO; Final Office Action dated Dec. 9, 2010; from U.S. Appl. No. 11/944,023, filed Nov. 21, 2007.
USPTO; Office Action dated Oct. 3, 2011; from U.S. Appl. No. 13/154,150, filed Jun. 6, 2011.
USPTO; Office Action dated Mar. 1, 2012; from U.S. Appl. No. 11/944,168, filed Nov. 21, 2007.
USPTO; Office Action dated Jan. 10, 2014; from U.S. Appl. No. 13/477,610, filed May 22, 2012.
USPTO; Office Action dated May 9, 2014; from U.S. Appl. No. 13/477,610, filed May 22, 2012.
USPTO; Office Action dated Jul. 31, 2014; from U.S. Appl. No. 13/477,610, filed May 22, 2012.
USPTO; Office Action dated Nov. 20, 2014; from U.S. Appl. No. 13/477,610, filed May 22, 2012.
USPTO; Office Action dated Apr. 13, 2015; from U.S. Appl. No. 13/477,610, filed May 22, 2012.

* cited by examiner

ERROR CORRECTION METHODS AND APPARATUSES USING FIRST AND SECOND DECODERS

This application is a Continuation of U.S. application Ser. No. 13/672,433 filed on Nov. 8, 2012, now U.S. Pat. No. 9,577,673, the contents of which are incorporated herein by reference in its entirety.

BACKGROUND

Field

The present application relates generally to error correction methods and memory devices.

Description of the Related Art

Error correction codes (ECCs) have been used to detect and/or correct errors in data read from memory devices. Examples of such codes include, but are not limited to Bose-Chaudhuri-Hocquenghem (BCH) codes, Hamming codes, and Reed-Solomon (RS) codes. Decoders configured to decode data encoded with such codes (hereinafter referred to as a "codeword") can be incorporated in, for example, controllers, such as an internal controller of a memory device (e.g., a managed NAND device) and/or an external controller configured to be coupled to a memory device(s), among other apparatuses.

In some memory devices, hard data and/or soft data can be read (e.g., sensed and/or transferred) from the memory cells of the memory devices. Hard data can indicate the detected data state of a memory cell that has been read. For example, hard data can indicate whether such a memory cell was sensed to be in a data state representing a binary value of "1" or a data state representing a binary value of "0" (for the page being read). Meanwhile, soft data can indicate more precisely where within the detected data state the memory cell was sensed. For example, soft data can indicate whether such a memory cell was sensed to be within a first portion, a second portion, or a third portion of the detected data state. Some current state of the art ECC decoders, such as low density parity check (LDPC) code decoders, can take advantage of soft data when decoding a codeword. However, working with soft data has various challenges. For example, it may take longer to sense data including soft data than to sense data including only hard data. As another example, transferring soft data from a memory device through an interface, such as the Open NAND Flash Interface (ONFI), can result in a high throughput penalty as more bits of data are transferred than if only hard data was transferred.

Conventional LDPC decoders run a sufficient number of iterations to correct errors in a codeword. As a result, the LDPC decoder can utilize significant power, since running, for example, two iterations will consume approximately twice as much power as running a single iteration. In applications having extremely tight power budgets, this can prevent or inhibit employing a powerful LDPC decoder. In addition, when the input to the LDPC decoder consists of only hard data, the LDPC decoder may need to run more iterations than it would otherwise need if soft data was also input to the LDPC decoder. Also, a different number of iterations may need to be run depending on the number of errors in the codeword, which can pose a serious problem if the application needs a "sustained throughput" and does not tolerate variations in the throughput.

DETAILED DESCRIPTION

Figure 1:
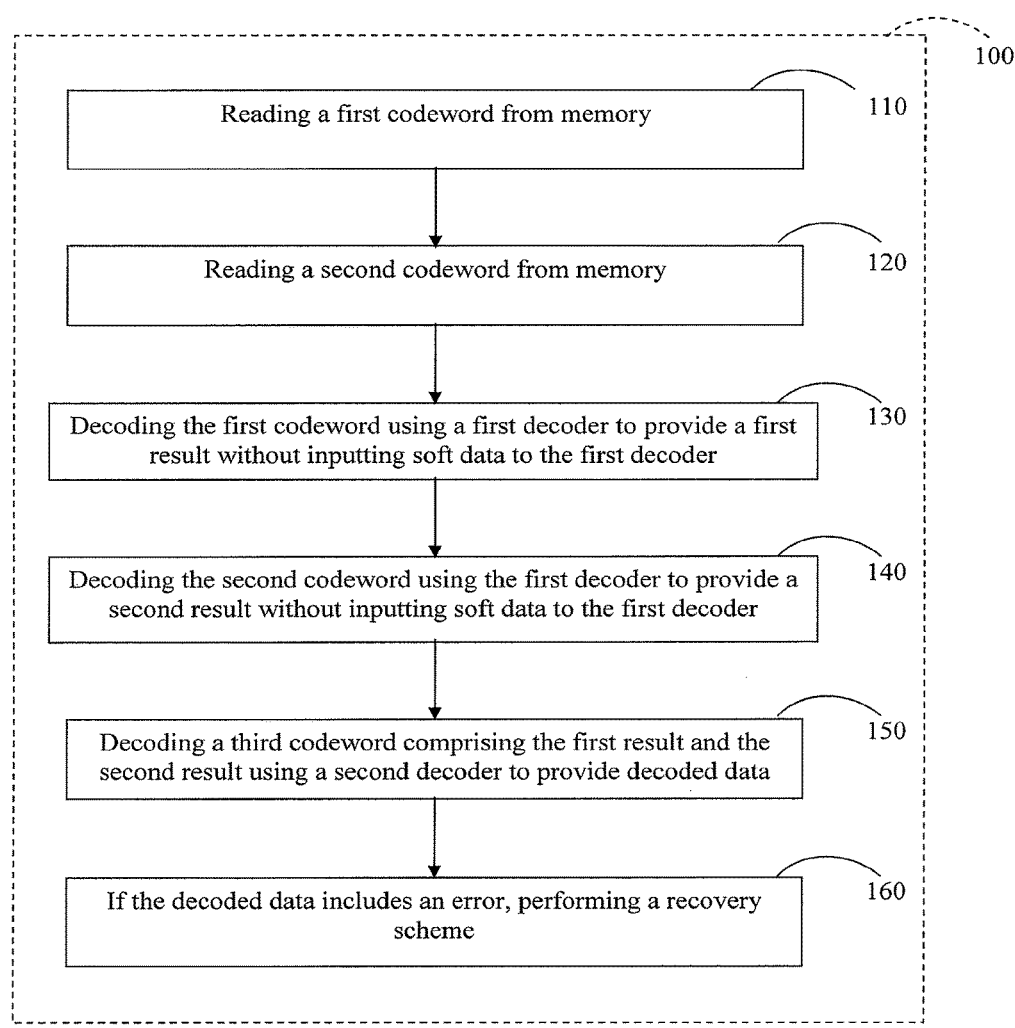
FIG. 1 is a flow diagram of an example method for error correcting data in accordance with certain embodiments described herein.

Certain embodiments described herein are particularly compatible for use with flash memory, a form of erasable and reprogrammable non-volatile memory. In a flash memory, memory cells are arranged in "blocks" for erasure. After a block has been erased, it is ready for programming if desired. NOR flash memory is a type of flash memory that offers access to individual memory cells for retrieval of data, but has relatively low density. NAND flash memory is a type of flash memory that offers relatively high density. The high density is achieved in part by forming strings of memory cells connected in series. In addition, with NAND flash memory, data is accessed (e.g., programmed and read) in relatively large groups of bytes, such as a page of data. For example, a page can correspond to a row or to a portion of a row of memory cells in an array. Flash memory can be used in many apparatuses, including but not limited to solid state drives (replacements for hard drives), USB flash drives or thumb drives, mobile phones, digital cameras, digital media players, games, memory cards, navigation devices, personal digital assistants, computers, or the like. Although many of the embodiments described herein are discussed in the context of flash memory, other forms of memory might also benefit from the technology discussed herein.

Some memory devices and/or controllers are capable of operating in a hard data only mode, where only hard data is sensed and/or transferred, and a soft data mode(s), where soft data, corresponding to the hard data, is sensed and/or transferred along with the hard data. In view of the challenges discussed herein, it can be desirable to operate in the hard data only mode as much as possible. For example, a memory device and/or controller can generally be operated in the hard data only mode, but the memory device and/or controller can switch to the soft data mode in certain circumstances, such as after a particular number of program-erase (P/E) cycles and/or when operated in certain retention modes. Furthermore, the default operating mode of a memory device and/or controller in some embodiments can be the hard data only mode.

Concatenated coding schemes, in which multiple codes are concatenated (e.g., LDPC and BCH codes), have been proposed, such as in, for example, U.S. Pat. Appl. Publ. No. 2009/0013234; E. Yeo, "An LDPC-Enabled Flash Controller in 40 nm CMOS," Flash Memory Summit 2012, Santa Clara, Calif.; M. Jedrak, "ECC in NAND Flash Controller," Flash Memory Summit 2012, Santa Clara, Calif.; N. Xie et al., "Concatenated Low-Density Parity-Check and BCH Coding System for Magnetic Recording Read Channel with 4 kB Sector Format," IEEE Trans. On Magnetics, Vol. 44, No. 12, December 2008, pp. 4784-4789. In certain embodiments described herein, the resources (e.g., ECC bits) of a first code (e.g., BCH code) are pooled for multiple inner codewords (e.g., LDPC codewords), such as to more efficiently utilize the redundancy of the first code by offering the pooled first code resources to codewords of a second code (e.g., LDPC code) that may be in need of extra correction. For example, in at least some of the disclosed embodiments, an inner decoder (e.g., a LDPC decoder) can run up to a particular number of iterations (e.g., a single iteration) to do as much error correction as possible with the limited number of iterations. An outer decoder (e.g., a BCH decoder) can be used to correct residual errors left after the inner decoder (e.g., the LDPC decoder) runs its limited number of iterations. The outer decoder can also deal with potential error floor or miscorrection issues arising from the use of the inner code decoder. For example, the inner decoder may decode the input data to a valid codeword that is different than the correct codeword or may become trapped, and the outer decoder can potentially correct these errors. If the default concatenated coding scheme is unable to correct (e.g., clear) all the errors, the controller and/or memory device can access the memory cells again to read soft data, provide the soft data to the inner decoder, and allow the inner decoder to run more than the particular number of iterations.

If performance of a scheme when only hard data is input to a decoder (hereinafter "hard data performance") was the only performance criterion, then a trade-off could be made between the redundancies of the inner code (e.g., LDPC code) and the outer code (e.g., BCH code) to improve the performance. For example, the LDPC redundancy could be reduced and the BCH redundancy could be increased while keeping the total ECC budget the same. The number of available ECC bits used for LDPC can be reduced and instead these ECC bits can be devoted to BCH by allocating more of the ECC resources to BCH (thereby providing an increased T level), and allocating less of the ECC resources to LDPC. However, doing so may reduce the soft data performance of such a scheme (e.g., the performance of such a scheme when soft data is also input to the decoder and the decoder runs multiple iterations). Given that the total bits/bytes written (TBW) is a function of recovery performance, any hard input performance improvement should not jeopardize the recovery performance which utilizes soft data.

On the other hand, if soft data performance is the only important metric and power is not a constraint (such that multiple decoder iterations could be run) and soft data is always available, from a raw bit error rate (RBER) point of view, it could be advantageous to use the whole ECC budget for LDPC code (e.g., using all the available ECC bits for LDPC).

In certain schemes with a limited number of iterations (e.g., a single iteration), the inner decoder (e.g., a LDPC decoder) might be unable to correct all the errors in an inner codeword, except for very low RBERs. The outer decoder (e.g., a BCH decoder) can thus be used to correct residual errors left after the limited number of iterations of the inner decoder (e.g., the LDPC decoder) are run, but an inefficiency can result from a concatenated ECC scheme in which the inner decoder (e.g., LDPC decoder) does not fully utilize the correction capability of the outer decoder (e.g., the T-level of the BCH code), as the following example illustrates.

In an example scenario, four LDPC codewords are used:
Codeword 1 has 10 bit errors after decoding using the LDPC decoder
Codeword 2 has 25 bit errors after decoding using the LDPC decoder
Codeword 3 has 15 bit errors after decoding using the LDPC decoder
Codeword 4 has 5 bit errors after decoding using the LDPC decoder These four codewords have a total of 55 bit errors. If each LDPC codeword is protected by a respective BCH codeword, and assuming that the BCH code has a T-level of 20, the concatenated coding scheme could correct the three LDPC codewords having fewer bit errors than the T-level of the BCH code, but would not correct codeword 2 since it has more bit errors than the T-level of the BCH code.

Instead, in certain embodiments, multiple LDPC codes are protected with a single larger BCH codeword (i.e., in comparison to the size of a codeword used in the "respective" BCH codeword scheme discussed in the previous paragraph), so that the BCH redundancy is used more efficiently. In other words, the outer code (e.g., BCH code) redundancy (e.g., ECC bits for the BCH code) is pooled for multiple codewords of the inner code (e.g., LDPC code). Thus, for N inner codewords that are protected with a single larger outer codeword, if all but one of the inner codewords is fully corrected after decoding with the inner decoder, then the inner codeword still having errors will have the correction capability of approximately N times the rate of the outer code for the respective codeword scheme. For example, assuming that the four LDPC codewords described above are protected using a single larger BCH codeword with the same redundancy (e.g., the number of BCH ECC bits in the single BCH codeword is the same as the total number of BCH ECC bits used in the respective codeword scheme), the BCH code can have a T-level that is slightly less than 4*20=80. In such an example case, all four inner LDPC codewords could be corrected by such a concatenated coding scheme.

Certain such embodiments utilize the redundancy (e.g., ECC bits) of the outer code (e.g., BCH code) more efficiently, so a higher RBER number can be supported as compared to a "respective" codeword concatenation scheme. In certain embodiments, a higher supported RBER number for the hard data only mode will advantageously reduce the need to operate in a soft data mode. In addition, the soft data RBER performance in certain embodiments will be unaffected, unlike other schemes that can potentially improve hard data performance while deteriorating soft data performance. Also, certain embodiments described herein are scalable. For example, depending on the hardware constraints, as few as two inner codewords can be protected by the same outer codeword. Pooling outer code resources for more than two inner codewords can translate into a higher supported RBER number for hard data performance.

In certain embodiments in which N inner codewords are protected by a single outer codeword, initial inner decoding latency for the scheme can be higher (e.g., instead of a single inner codeword time latency, a time latency of N times the single inner codeword time latency). The N decoded results provided by the inner decoder (for the N inner codewords) can be buffered before the outer decoder starts decoding, which can result in higher buffering. For example, even if only a single inner codeword worth of data is desired to be accessed, N inner codewords will be decoded since the outer decoder will need the results of all N inner codewords from the inner decoder. In certain embodiments, the correction capability (e.g., T-level) of a scheme using a single larger outer codeword can be slightly less than N times the correction capability of a scheme using N outer codewords that match the size of N inner codewords. Slight performance degradation may result at very high RBER levels that are outside the typical operating range.

FIG. 1 is a flow diagram of an example method 100 for error correcting data in accordance with certain embodiments described herein. In an operational block 110, the method 100 comprises reading a first codeword from memory. In an operational block 120, the method 100 further comprises reading a second codeword from the memory. In an operational block 130, the method 100 further comprises decoding the first codeword using a first decoder to provide a first result without inputting soft data to the first decoder. The first decoder runs up to a particular number of iterations to provide the first result. In an operational block 140, the method 100 further comprises decoding the second codeword using the first decoder to provide a second result without inputting soft data to the first decoder. The first decoder runs up to the particular number of iterations to provide the second result. In an operational block 150, the method 100 further comprises decoding a third codeword using a second decoder to provide decoded data. The third codeword comprises the first result and the second result. In an operational block 160, the method 100 further comprises performing a recovery scheme if the decoded data includes an error.

In certain embodiments, the memory comprises flash memory having a plurality of memory cells. Reading the first and second codewords from the memory in the operational blocks 110 and 120 of certain embodiments comprises detecting (e.g., sensing) data states of a plurality of memory cells storing the first codeword and the second codeword and transferring hard data indicating the detected states to a controller. In certain embodiments, more than two codewords can be detected (e.g., sensed) in the operational blocks 110, 120. For example, reading the first and second codewords can be performed as part of a process of detecting (e.g., sensing) data states of a page of memory having a plurality of codewords. The detected (e.g., sensed) data states of the page can then be transferred (e.g., via an ONFI interface) to the controller.

Decoding the first and second codewords using a first decoder in the operational blocks 130 and 140 of certain embodiments can include using an inner decoder to decode inner codewords consisting of the hard data read in the operational blocks 110 and 120 using a first ECC decoding procedure. Examples of the first ECC decoding procedure include but are not limited to an LDPC code decoding procedure (e.g., performed by an LDPC decoder) and/or a Turbo code decoding procedure (e.g., performed by a Turbo decoder) and/or a turbo-product code decoding procedure (e.g., performed by a turbo-product decoder) and/or a lattice code decoding procedure (e.g., performed by a lattice decoder) and/or a polar code decoding procedure (e.g., performed by a polar decoder) and/or a general linear block code decoding procedure (e.g., performed by a general linear block decoder). In certain embodiments, the particular number of iterations run up by the first decoder in the first ECC decoding procedure to provide either the first result or the second result is one, while in certain other embodiments, the particular number of iterations is two, three, or more. Having the particular number of iterations equal to one, which limits the first ECC decoding procedure to a single iteration, can provide the advantage of reduced power consumption as compared to allowing the decoder to run a higher number of iterations.

Figure 3:
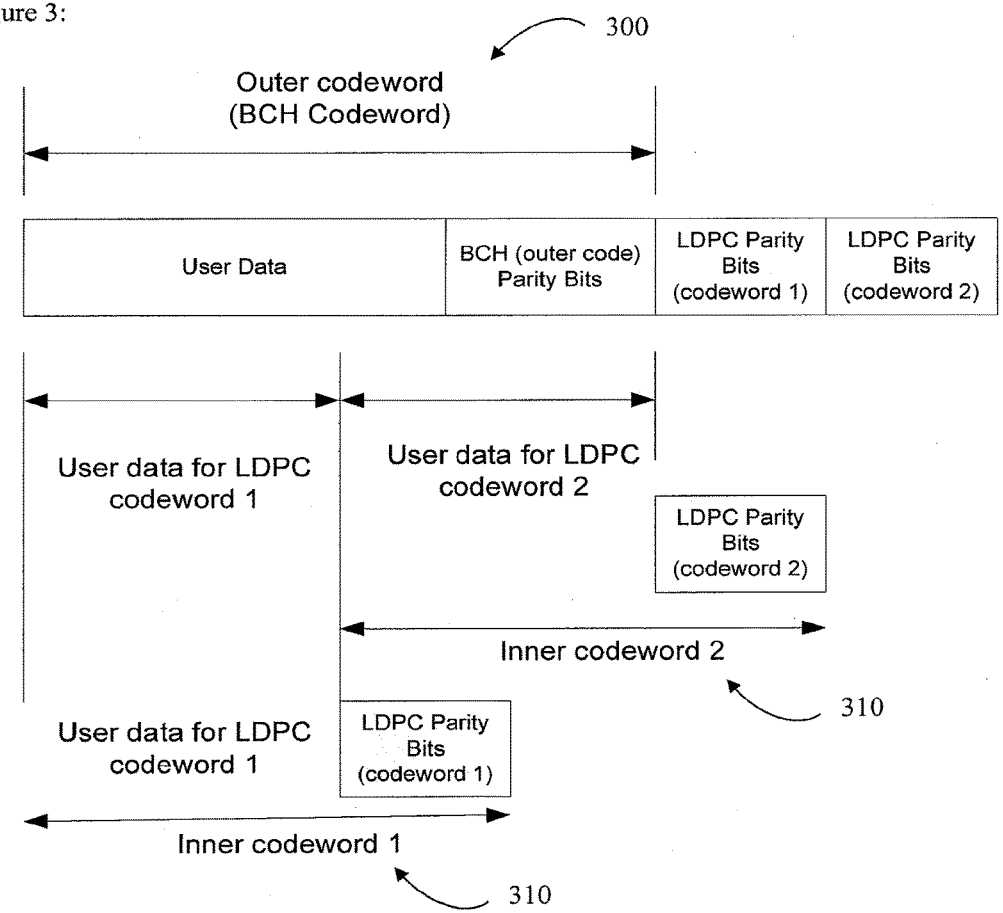
FIG. 3 schematically illustrates an outer codeword and two inner codewords in accordance with certain embodiments described herein.

The results of decoding the first and second codewords can be grouped together to form a third codeword which can be decoded in the operational block 150. For example, the first result of decoding the first codeword can be buffered while the second codeword is decoded, such that the first and second results provided in the operational blocks 130 and 140 can be grouped together (e.g., concatenated and/or interleaved) to form a third codeword. Although examples are primarily discussed herein in which two inner codewords are grouped together to form an outer codeword, embodiments are not limited thereto. For example, other embodiments might group together 3, 4, 5, 6, 7, 8 or more inner codewords. One or more of the inner codeword can protect parity bits of the outer code as well as the user data bits. For example, as schematically illustrated by FIG. 3, an inner LDPC codeword can protect all the BCH parity bits. However, in certain other embodiments, the BCH parity can be interleaved or can be separated and spread to some or all of the other inner codewords. In certain embodiments in which each inner codeword (e.g., the first codeword and the second codeword) has a width of 512 bytes, 1 kilobyte, or 2 kilobytes, the outer codeword (e.g., the third codeword) can have a width of, for example, 1, 2, 4, 6, 8, 10, 12, 14, or 16 kilobytes.

Decoding a third codeword using a second decoder to provide decoded data in the operational block 150 of certain embodiments can include using an outer decoder to decode the third codeword formed by the first and second results provided in the operational blocks 130 and 140. Examples of the second ECC decoding procedure include but are not limited to a BCH code decoding procedure (e.g., performed by a BCH decoder) and/or a RS code decoding procedure (e.g., performed by a RS decoder) and/or a bit-based decoding procedure (e.g., performed by a bit-based decoder) or a symbol-based decoding procedure (e.g., performed by a symbol-based decoder). For example, the BCH code decoding procedure can have a correction capability (T-level) in a range between 20 and 160, in a range having a lower bound of 20, 30, 40, 50, or 60, having an upper bound of 100, 110, 120, 130, 140, 150, or 160, or having any combination of these lower bounds and upper bounds.

An evaluation of whether the decoded data includes an error in the operational block 160 of certain embodiments can comprise generating a signal indicative of whether the decoded data includes at least one bit error or whether the decoded data does not include at least one bit error. In certain embodiments, the evaluation can be performed by the outer decoder (e.g., BCH decoder), while in certain other embodiments, the evaluation can be performed by an evaluation module separate from the outer decoder, with the evaluation module utilizing error detection codes (EDCs) such as cyclic redundancy check (CRC) codes.

In operational block 160, a recovery scheme can be performed if the decoded data includes an error. For example, soft data corresponding to the first and second codewords can be read from the memory (e.g., either re-reading the first and second codewords along with the soft data and/or just reading the soft data or just transferring soft data previously sensed by the memory device, but not originally transferred when in the hard data only mode). The first and second codewords can then be re-decoded by the first (e.g., inner) decoder using the soft information and/or allowing the first decoder to run for more than the particular number of iterations. Third and fourth results provided by re-decoding the first and second codewords, respectively, can then be grouped together as a fourth codeword. The second (e.g., outer) decoder can then decode the fourth codeword to provide re-decoded data.

In certain embodiments, the method 100 for error correcting data has a total ECC budget (e.g., total number of ECC bits in a page and/or block), divided between the first ECC scheme (e.g., LDPC code) and the second ECC scheme (e.g., BCH code). The ECC budget can be expressed as the maximum allowed redundancy for the error correction codes. For some systems, the ECC budget is determined by the spare portion (e.g., the size of spare area of a page) of the non-volatile memory system (e.g., flash memory device).

For example, the total ECC budget can be in a range between 5% and 20% of the bits in a page or block of data, in a range between 5% and 15% in a page or block of data, or in a range between 7% and 12% in a page or block of data. In certain embodiments, the first ECC scheme (e.g., LDPC code) can use between two-thirds and nine-tenths of the total ECC budget. For example, for a total ECC budget of 10% of a page or block of data, the first ECC scheme can use between 67% and 90% of the total ECC budget (e.g., 8% of a page or block of data). In certain embodiments, the second ECC scheme (e.g., BCH code) can use between one-tenth and one-third of the total ECC budget. For example, for a total ECC budget of 10%, the second ECC scheme can use between 10% and 33% of the total ECC budget (e.g., 2% of a page or block of data).

Figure 2:
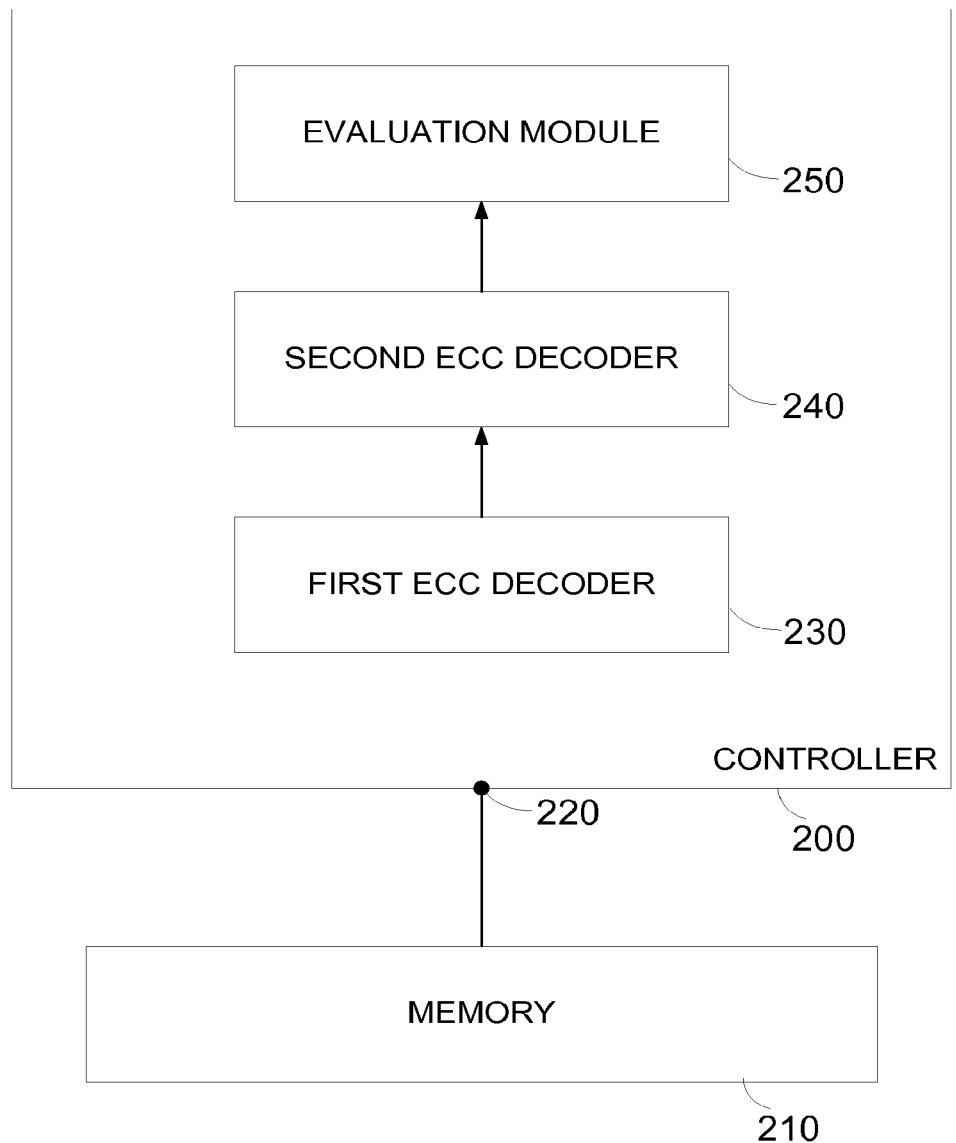
FIG. 2 schematically illustrates an example apparatus configured to perform a method for error correcting data in accordance with certain embodiments described herein.

FIG. 2 schematically illustrates an apparatus in the form of a controller 200 coupled to memory 210 in accordance with certain embodiments described herein. As understood, among other possibilities, the memory 210 can be a memory device (e.g., a NAND flash memory device or a plurality of NAND flash memory devices) and the controller 200 can be an external controller coupled to the memory device(s), or memory 210 can be an array of memory cells and controller 200 can be an internal controller coupled to the array (e.g., where the combination of the internal controller and array form part of a memory device). Examples of devices comprising a controller 200 in accordance with certain embodiments described herein include but are not limited to solid state drives, USB flash drives, thumb drives, mobile phones, digital cameras, digital media players, games, memory cards, navigation devices, personal digital assistants, computers, or the like.

The controller 200 of certain embodiments has a first ECC decoder 230 configured to decode (at least) first and second codewords read from the memory 210 and provide first and second results, respectively. The first ECC decoder 230 can run up to a particular number of iterations to decode the first and second codewords. For example, in certain embodiments, the first ECC decoder 230 can be a single decoder that operates on the inner codewords serially, and that runs up to a particular maximum number of iterations for each of the codewords. For example, the first ECC decoder 230 can comprise a single decoder configured to generate multiple codewords serially, using up to a particular maximum number of iterations for each of the codewords. In certain other embodiments, the first ECC decoder 230 can comprise multiple decoders that operate on the inner codewords in parallel with one another, with the inner decoders running up to a particular maximum number of iterations for each of the codewords. For example the first ECC decoder 230 can comprise multiple decoders configured to generate multiple codewords in parallel, using up to a particular maximum number of iterations for each of the codewords The controller 200 further comprises a second ECC decoder 240 configured to decode a third codeword (that comprises the first and second results) to provide decoded data. The controller 200 further comprises an evaluation module 250 configured to initiate a recovery scheme (e.g., by responding to an error in the decoded data by generating a signal configured to initiate the recovery scheme). One such recovery scheme might involve reading soft data (corresponding to the hard data constituting the first and second codewords) from the memory and re-decoding the first and second codewords using the soft data.

The third codeword of certain embodiments can comprise an outer codeword comprising a plurality of inner codewords, including the first and second codewords. FIG. 3 schematically illustrates an outer codeword 300 and two inner codewords 310 in accordance with certain embodiments described herein. The outer codeword 300 can comprise a number of outer ECC bits (e.g., BCH ECC bits) and a number of user data bits. Each inner codeword 310 can comprise a number of user data bits and a number of inner ECC bits (e.g., LDPC ECC bits). The second ECC decoder 240 of certain embodiments can be configured to use the outer ECC bits to correct errors in the user data bits and the first ECC decoder 230 can be configured to use the inner ECC bits to correct errors in the user data bits and outer code ECC bits. In certain embodiments, the number of inner ECC bits is greater than the number of outer ECC bits (e.g., about four times greater). In certain embodiments, the number of inner and outer ECC bits in the third codeword comprises about 10% of a number of bits in a page of memory.

The controller 200 has an input 220 configured to receive codewords read from the memory 210. In certain embodiments, the input 220 comprises an open NAND flash interface (ONFI), while in certain other embodiments, the input comprises other types of interfaces. In certain embodiments, the first ECC decoder 230 comprises a LDPC decoder and the second ECC decoder 240 comprises a BCH decoder. The evaluation module 250 of certain embodiments is a separate component from the second ECC decoder (e.g., which utilizes an error detection code such as CRC), while in certain other embodiments, the evaluation module 250 is a component of the second ECC decoder 240 or the second ECC decoder 240 is a component of the evaluation module 250.

In an embodiment where the second ECC decoder comprises a BCH decoder, the BCH decoder can be configured to calculate a syndrome to determine whether the third codeword includes any errors. For example, a zero syndrome may indicate that the third codeword includes no errors. If the syndrome is non-zero, such a decoder may be configured to determine the number of errors in the third codeword and the location of those errors in the third codeword. For example, the decoder may determine an error locator polynomial from the syndrome in accordance with an algorithm, such as the Berlekamp-Massey algorithm or the Peterson-Gorenstein algorithm, and calculate the roots of the error locator polynomial to identify the location(s) of the error(s) in the third codeword. In the case of a binary BCH, a decoder can invert a respective bit of data at each of those locations in the third codeword to correct the error, thus providing decoded data. If non-binary BCH codes are used, a decoder can calculate the error values at those locations and use the calculated error values to correct the third codeword, thus providing decoded data.

In certain embodiments in which the apparatus further comprises memory (e.g., a memory device, examples of which include but are not limited to a NAND Flash memory device which can be coupled to the controller 250 through an ONFI interface), the memory can be coupled to a controller 200 comprising the first ECC decoder 230, the second ECC decoder 240, and the evaluation module 250. The controller 200 can be configured to read the first and second codewords from the memory while operating in a hard data only mode. In certain embodiments, the evaluation module 250 being configured to initiate a recovery scheme comprises the evaluation module 250 being configured to switch an operating mode of the controller 250 from the hard data only mode to a soft data mode. In certain embodiment, while operating in the soft data mode, the controller 250 can be configured to read soft data from the memory corresponding to the first and second codewords, to re-decode the first and second codewords with the first ECC decoder 230 to provide third and fourth results, respectively, and to decode a fourth codeword using the second ECC decoder 240 to provide re-decoded data, wherein the fourth codeword comprises the third and fourth results.

Figure 4:
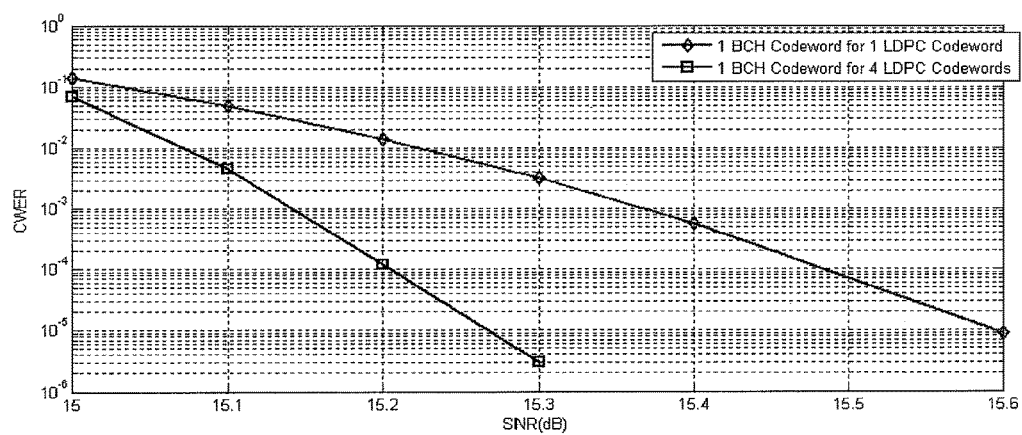
FIG. 4 is a graph of the performance of an example controller utilizing a single iteration of LDPC inner decoding with BCH outer decoding in accordance with certain embodiments described herein.

FIG. 4 is a graph of the performance of an example controller utilizing a single iteration of LDPC inner decoding with BCH outer decoding in accordance with certain embodiments described herein. The horizontal axis is the signal-to-noise ratio (SNR) in decibels, and the vertical axis is the codeword failure rate or block error rate (CWER). The input to the LDPC inner decoder is hard data from flash memory.

The open diamonds denote the results using a respective BCH codeword for each LDPC codeword, and the open squares denote the results using a single BCH codeword for four grouped LDPC codewords. As can be seen in FIG. 4, for the single BCH codeword for four LDPC codewords, a codeword error rate (CWER) of $10^{-5}$ is reached at a lower SNR (higher noise) than for the respective BCH codeword for each LDPC codeword. Thus, using a single BCH codeword for four LDPC codewords results in improved performance as compared to the respective BCH codeword for each LDPC codeword. Although specific embodiments have been discussed here where the recovery scheme involves reading soft data and re-decoding the inner codewords, embodiments may utilize other recovery schemes in addition to or in place of such a scheme. For example, another recovery scheme may involve re-decoding the inner codewords by allowing the inner decoder to run more than the particular number of iterations without reading and/or inputting soft data into inner decoder. Other example recovery schemes include, but are not limited to, re-reading the hard data several times and averaging the values, or doing channel calibration and re-reading the hard data.

Various embodiments have been described above. Although this invention has been described with reference to these specific embodiments, the descriptions are intended to be illustrative and are not intended to be limiting. Various modifications and applications may occur to those skilled in the art and all such modifications are intended to be within the appended claims.

What is claimed is:

1. A method for error correcting data performed by an apparatus, the method comprising:
    using a controller to read a first codeword from memory;
    using the controller to read a second codeword from the memory;
    decoding the first codeword using a first decoder, without inputting soft data to the first decoder, to yield a first result;
    decoding the second codeword using the first decoder, without inputting soft data to the first decoder, to yield a second result;
    combining the first result and the second result to form a third codeword;
    decoding the third codeword using a second decoder to yield decoded data;
    determining, by the second decoder, whether the decoded data includes an error; and
    responsive to determining that the decoded data includes an error, performing a recovery scheme comprising:
        reading, from the memory, soft data corresponding to the first codeword and soft data corresponding to the second codeword;
        providing the soft data corresponding to first codeword and the soft data corresponding to the second codeword to the first decoder only when the decoded third codeword includes the error;
        re-decoding the first codeword using the first decoder using the soft data corresponding the first codeword to yield a third result;
        re-decoding the second codeword using the first decoder using the soft data corresponding the second codeword to yield a fourth result;
        combining the third result and the fourth result to form a fourth codeword; and
        decoding the fourth codeword using the second decoder.

2. The method of claim 1, wherein decoding the first codeword comprises decoding the first codeword with a low density parity check (LDPC) decoder, and wherein decoding the second codeword comprises decoding the second codeword using the LDPC decoder.

3. The method of claim 1, wherein decoding the third codeword comprises decoding the third codeword using a bit-based decoder.

4. The method of claim 1, wherein using the controller to read the first and second codewords comprises receiving the first and second codewords at the controller over an interface coupled between the controller and the memory.

5. The method of claim 1, further comprising:
    sensing the first codeword from a first plurality of memory cells of the memory; and
    sensing the second codeword from a second plurality of memory cells of the memory.

6. The method of claim 1, wherein decoding the first and second codeword comprises running the first decoder up to a particular number of iterations to yield the first result and the second result, respectively.

7. The method of claim 1, wherein decoding the first and second codeword comprises running the first decoder for one iteration to yield the first result and the second result, respectively.

8. An apparatus, comprising:
    a first decoder associated with a first error correction code (ECC) decoding procedure and configured to:
        decode a plurality of inner codewords without receiving an input of soft data, each of the plurality of inner codewords comprising user data and first ECC bits; and
        combine results of decoding the plurality of inner codewords to yield an outer codeword comprising the user data of the plurality of inner codewords and second ECC bits;
    a second decoder associated with a second ECC decoding procedure and configured to decode the outer codeword and to use the second ECC bits to correct errors in the user data, wherein the first ECC decoding procedure is different than the second ECC decoding procedure;
    wherein the first decoder is further configured to use the first ECC bits to correct errors in the second ECC bits and errors in the user data; and
    an evaluation module configured to:
        determine whether the decoded outer codeword includes an error; and
        responsive to determining that the decoded outer codeword includes an error:
            initiate a recovery scheme;
            read, from memory, soft data corresponding to the plurality of inner codewords; and
            provide the soft data to the first decoder in association with re-decoding the plurality of inner codewords.

9. The apparatus of claim 8, wherein a number of the first ECC bits is greater than a number of the second ECC bits.

10. The apparatus of claim 8, wherein the first decoder, the second decoder, and the evaluation module comprise a controller.

11. The apparatus of claim 10, wherein the controller is configured to read the first and second codewords from the memory while operating in a hard data only mode.

12. The apparatus of claim 8, wherein the evaluation module is a component of the second decoder.

13. The apparatus of claim 8, wherein the first decoding procedure is a low density parity check (LDPC) decoding procedure, and
wherein the second decoding procedure is a Reed-Solomon (RS) decoding procedure.

14. A non-transitory computer readable medium storing instructions executable by a processing resource to:
read inner codewords from memory;
decode the inner codewords using a first decoder, without inputting soft data to the first decoder;
combine results from decoding the inner codewords to yield a first outer codeword;
decode the first outer codeword using a second decoder;
determine whether the decoded first codeword includes an error; and
responsive to determining that the decoded first outer codeword includes an error:
read soft data, corresponding to the inner codewords, from the memory;
re-decode the inner codewords using the first decoder using the soft data corresponding to the inner codewords;
combine the re-decoded inner codewords to form a second outer codeword; and
decode the second outer codeword using the second decoder.

15. The medium of claim 14, further comprising instructions executable to:
determine an error in the outer codeword.

16. The medium of claim 14, further comprising instructions executable to decode the inner codewords and the outer codeword with a total error correction code (ECC) budget.

17. The medium of claim 14, further comprising instructions executable to decode the inner codewords serially using the first decoder.

* * * * *